United States Patent
Vickers et al.

[11] Patent Number: 6,047,246
[45] Date of Patent: Apr. 4, 2000

[54] COMPUTER-CONTROLLED ULTRASONIC CLEANING SYSTEM

[76] Inventors: John W. Vickers; Jim H. Stedt, both of 1740 E. Garry Ave., Suite 230, Santa Ana, Calif. 92705

[21] Appl. No.: 08/863,105

[22] Filed: May 23, 1997

[51] Int. Cl.⁷ ...................................................... H03S 9/04
[52] U.S. Cl. .................. 702/105; 204/157.42; 264/407; 422/20; 429/4; 427/560
[58] Field of Search .......................... 702/85, 105, 107, 702/39; 73/182; 204/157.42; 264/407, 442; 422/20, 128; 427/560, 565, 600; 429/4; 433/86, 119; 134/184.1

[56] References Cited

U.S. PATENT DOCUMENTS

| | | | |
|---|---|---|---|
| 5,178,134 | 1/1993 | Vago | 128/24 AA |
| 5,178,173 | 1/1993 | Erckson et al. | 134/184 |
| 5,218,980 | 6/1993 | Evans | 134/68 |
| 5,305,737 | 4/1994 | Vago | 601/4 |
| 5,333,628 | 8/1994 | Ogata et al. | 134/64 R |
| 5,368,153 | 11/1994 | Koretsky et al. | 134/153 |
| 5,403,555 | 4/1995 | Steinhauser et al. | 422/128 |
| 5,432,969 | 7/1995 | Oh | 8/159 |
| 5,447,171 | 9/1995 | Shibano | 134/102.2 |
| 5,462,604 | 10/1995 | Shibano et al. | 134/1 |
| 5,496,411 | 3/1996 | Candy | 134/1 |
| 5,505,218 | 4/1996 | Steinhauser et al. | 134/95.1 |
| 5,593,507 | 1/1997 | Inada et al. | 134/11 |
| 5,617,887 | 4/1997 | Shibano et al. | 134/184 |
| 5,625,249 | 4/1997 | Grant | 310/334 |
| 5,686,045 | 11/1997 | Carter | 422/20 |
| 5,690,750 | 11/1997 | Inada et al. | 134/11 |
| 5,803,099 | 9/1998 | Sakuta et al. | 134/56 R |

*Primary Examiner*—Patrick Assouad
*Attorney, Agent, or Firm*—Albert O. Cota

[57] ABSTRACT

A computer-controlled ultrasonic cleaning system (10) that is designed to clean various articles ranging from integrated-circuit silicone wafers and hard disk platters to small mechanical components. The system (10) utilizes an electronic system which operates in combination with a computer (12) and software (14) to activate a plurality of crystal transducers (32). The crystal transducers (32), which are located on the lower surface of a cleaning tank (40) convert electrical energy, supplied by the electronic system, to acoustic/mechanical energy with a conversion efficiency near 80 percent. The system software includes a program that automatically calibrates the system and corrects crystal-to-crystal deficiencies to maintain the system (10) in a peak operating condition.

20 Claims, 11 Drawing Sheets

Fig.1

MAIN CONTROL ROUTINE

Fig. 2

CRYSTAL CALIBRATION SUBROUTINE

Fig. 3A

CRYSTAL CALIBRATION SUBROUTINE

Fig. 3B

CRYSTAL CLEANING SUBROUTINE

COMPUTER-CONTROLLED ULTRASONIC CLEANING SYSTEM

TECHNICAL FIELD

The invention pertains to the general field of ultrasonic cleaners and more particularly to a computer-controlled ultrasonic cleaning system which utilizes a plurality of crystal transducers that are automatically maintained at peak operating efficiency.

BACKGROUND ART

Many of the devices, tools and machines that are in common use today, rely extensively on integrated circuits, semiconductors and other small components. Whereas the benefits from these types of devices are obvious, there are some difficulties that accompany their use. One such difficulty is that of maintaining the cleanliness of the devices themselves. Due to their small incredibly minute size and the fragile nature of their construction, specialized cleaning methods have been developed.

One method for cleaning integrated-circuit silicon wafers, hard disk platters and small mechanical components is to use spin clean systems. These spin clean systems involve the use of a high pressure water jet, at approximately 1200 psi. The water jet is vertically directed upon a rotating part to be cleaned, with the part being positioned therein below. The nozzle of the jet is attached to a reciprocating arm, so that the entire part can be accessed and cleaned. Often, though, the high pressure of the water impinging on the part causes damage. Also, high pressure spin clean systems are not economically well suited for a high volume manufacturing environment. These systems are relatively expensive, and require large quantities of ultra-pure, deionized water and the use of high pressure filters, which are needed to maintain the high water pressure and the purity of the water.

Another method of cleaning integrated circuit silicon wafers and hard disk platters is to immerse them in a cleaning tank filled with a cleaning solution. A periodic control signal is then applied to an ultrasonic vibrator, which typically consists of a piezoelectric element. The periodic control signal has a frequency equal to the natural frequency of the piezoelectric element. This allows the element to vibrate at its natural frequency, thereby radiating an ultrasonic energy into the cleaning solution. The radiated ultrasonic energy produces a cavitation in the cleaning solution, which generates shock waves to clean the parts immersed in the cleaning solution. To maintain uniform cleaning, it is necessary to generate the cavitation uniformly in the cleaning solution, without becoming dispersed throughout the solution. This is accomplished by radiating the ultrasonic energy at a higher frequency. The higher the frequency, the less likely any damage will be caused to the part. Conversely, if a stronger cleaning capability is desired, the ultrasonic energy is applied at a lower frequency.

The ultrasonic vibrators, are also available with multiple piezoelectric elements, having respective different natural frequencies. However, these vibrators are difficult and expensive to manufacture. Another problem is that the cavitation distribution becomes unstable due to the natural frequencies of the piezoelectric elements tendency to vary as a result of both the piezoelectric element manufacture, and the heat produced when the ultrasonic vibrator is oscillated. Consequently, it is difficult to clean many parts uniformly by using cavitations processes.

A search of the prior art did not disclose any patents that read directly on the claims of the instant invention, however the following U.S. patents are considered related:

| U.S. PAT. NO. | INVENTOR | ISSUED |
|---|---|---|
| 5,462,604 | Shibano, et al | 11 October 1995 |
| 5,432,969 | Oh | 18 July 1995 |
| 5,368,054 | Koretsky, et al | 29 November 1994 |
| 5,333,628 | Ogata, et al | 2 August 1994 |

The U.S. Pat. No. 5,462,604, Shibano, et al discloses an ultrasonic vibrator that has a single natural frequency for radiating ultrasonic energy into a cleaning solution to clean and deburr workpieces that are immersed in the cleaning solution. A plurality of oscillating signals having respective different frequencies, which are integral multiples of the natural frequency of the ultrasonic vibrator are generated, and successively produced. These signals are applied for respective periods of time to generate a composite signal which is composed of a timed series of oscillating signals. The composite signal is applied as a drive signal to the ultrasonic oscillator to oscillate the ultrasonic vibrator.

The U.S. Pat. No. 5,432,969, Oh discloses a washing method and a washing apparatus capable of obtaining a washing or cleaning effect by mechanical energy obtained by cavitation phenomena or nonlinear oscillation of micro air bubbles generated during the resonance of a multi-phase medium using low frequency waves. This invention eliminates the use of any pulsator, therefore, it is possible to considerably reduce the phenomenon that clothes get twisted or tangled. Moreover, the electric power consumption in washing or cleaning is greatly reduced.

The U.S. Pat. No. 5,368,054, Koretsky, et al discloses an ultrasonic jet semiconductor wafer cleaning apparatus for removing debris from a surface of a semiconductor wafer as the wafer is rotated about a prescribed axis in a cleaning plane. The apparatus comprises a housing having a principal axis, an inlet port, and an outlet port. A means for producing focused ultrasonic waves of acoustic energy that are concentric with and incident to the outlet port form a jet stream of cleaning liquid, which is released through the outlet port. A focal point positioning means for adjustably positioning a focal point of the focused ultrasonic wave producing means is located between a first focal point position and a second focal point position along an axis. A means coupled to the housing for sweeping the housing in an reciprocating manner along a sweep path is also included.

The U.S. Pat. No. 5,333,628 Ogata, et al discloses a continuous ultrasonic cleaning apparatus having excellent cleaning efficiency and holding/carrying capability of the product-to-be-cleaned. The continuous ultrasonic cleaning apparatus utilizes a cleaning agent receiving/storage bath having a cleaning agent supplying/adding function for the cleaning bath positioned there below and an ultrasonic oscillator. Net conveyors for holding the product-to-be-cleaned are used and synchronized for carrying the product-to-be-cleaned. No stain or water marks are formed and an equivalent cleaning quality can be achieved as that when using fulone. Furthermore, by using an oxygen-free water and purging inert gas for the entire receiving/storage bath, any product having a propensity to be easily corroded can be effectively cleaned.

For background purposes and as indicative of the art to which the invention is related reference may be made to the remaining cited patents.

| PATENT NO. | INVENTOR | ISSUED |
|---|---|---|
| 3,681,626 | Puskas | 1 August 1972 |
| 3,873,071 | Tatebe | 25 March 1975 |
| 4,183,011 | Massa | 8 January 1980 |
| 4,799,167 | Sarr | 17 January 1989 |
| 4,834,124 | Honda | 30 May 1989 |
| 4,979,994 | Dussalt, et al | 25 December 1990 |
| 4,991,609 | Browning | 12 February 1991 |
| 5,203,362 | Shibata | 20 April 1993 |
| 5,203,798 | Watanabe, et al | 20 April 1993 |
| 5,227,001 | Tamaki, et al | 13 July 1993 |
| 5,307,680 | Drescher-Krasicka | 3 May 1994 |
| 5,322,082 | Shibaflo | 21 June 1994 |
| 5,337,446 | Smith, et al | 16 August 1994 |
| 5,345,958 | Otsuka | 13 September 1994 |
| 5,377,709 | Shibaflo | 3 January 1995 |
| 5,378,287 | Pedziwiatr | 3 January 1995 |
| 5,409,594 | Al-Jiboory, et al | 25 April 1995 |
| 5,412,585 | Hamilton | 2 May 1995 |
| 5,444,892 | Ris, et al | 29 August 1995 |

DISCLOSURE OF THE INVENTION

The computer-controlled ultrasonic cleaning system is designed to automatically self-calibrate, providing optimum system performance, and to perform a preselected cleaning cycle that allows various articles placed into a cleaning tank, to be ultrasonically cleaned in an optimal manner. In its most basic form, the cleaning system consists of:

a) a computer having means for being operated by a keypad/display unit to run a dedicated software program which controls a self calibration procedure and an automatic cleaning cycle, b) an electronic system having means for operating in combination with the computer, and the software to produce a plurality of control signals, and c) a cleaning tank having a lower surface to which is attached a plurality of crystal transducers. The tank is filled with a liquid that is in contact with the crystal transducers to each of which is applied a control signal from the electronic system. The control signals, which are applied in a controlled sequence, cause the crystal transducers to sequentially produce ultrasonic waves of acoustic/mechanical energy which cleanse articles placed into the cleaning tank.

The electronic system is further comprised of the following elements:

a) a specially designed crystal control (CC) circuit having means for operating in combination with the computer and the software to monitor various input signals and to produce: a plurality of switch control signals. The circuit path of the CC circuit is as follows:

(1) an analog-to-digital converter receives and converts a plurality of signals which the software monitors for proper system function. Among these signals are the SWR forward and SWR reverse signals. These signals are used by the software to produce a digital control signal that is applied to a main oscillator via a digital-to-analog converter to produce the low-level a-c sinewave signal. The CC circuit also accepts signals from thermistors that are located to monitor hardware thermal status, and various power supply voltages, (2) a digital-to-analog converter converts the digital values from the software into corresponding voltage values which are then used to control the main oscillator which includes a voltage controlled oscillator (VCO). The VCO converts the output voltage levels from the digital-to-analog converter into a squarewave of known frequency, (3) a d-c voltage offset circuit converts the squarewave from the VCO into a squarewave which is symmetric about ground, (4) a signal pre-amplifier drives the power amplifier through a low pass filter, and (5) a filter removes the undesirable signal elements from the output waveform leaving only the primary sine function harmonic, b) an external d-c power supply capable of converting electrical power in the range of 80 to 240 volts a-c at 50 to 60 Hz into d-c power of 13.0 to 15.0 volts at 30 amps maximum, c) a power amplifier that accepts the low-level a-c sinewave signal from the CC circuit and the d-c power from the power supply. The amplifier amplifies the low-level a-c sinewave signal to produce a low-distortion high power (50 to 400 watts) output sinewave signal for driving the plurality of crystal transducers, d) a standing wave ratio (SWR) circuit which measures the power level of the high power, low distortion output signal from the power amplifier and produces a pair of d-c signals whose relative voltage level reflects the amplitude of the forward SWR signal and the reverse SWR signal respectively. These two signals are fed back to the analog-to-digital circuit on the CC circuit to be converted to data the software can process, e) a power switching circuit to whose bussed input is applied the output from the SWR circuit and that utilizes the plurality of input switch control signals from the CC circuit. The power switching circuit produces a power control signal to one crystal transducer at a time sequentially, and f) a power supply having means for supplying the required power levels to said electronic system.

In view of the above disclosure, it is the primary object of the invention to produce a computer-controlled ultrasonic cleaning system that utilizes a plurality of crystal transducers that operate in a controlled sequence and that are each maintained at peak operating efficiency.

In addition to the primary object it is also an object of the invention to produce a system that:

can be manufactured in various sizes and with a selected quantity of crystal transducer to accommodate various sizes and quantities of articles to be cleaned, is easily programmed to select optimum cleaning cycles, is user friendly, can be easily and quickly programmed from a front panel that incorporates a keypad and an LED or LCD video display panel, is designed to detect crystal transducer that is not operating at peak efficiency, is easily maintained, has a high reliability and is cost effective from both a manufacturer and consumer points of view.

These and other objects and advantages of the present invention will become apparent from the subsequent detailed description of the preferred embodiment and the appended claims taken in conjunction with the accompanying drawings.

BEST MODE FOR CARRYING OUT THE INVENTION

The best mode for carrying out the invention is presented in terms of a preferred embodiment for a computer-controlled ultrasonic cleaning system 10. The system 10 operates with a plurality of crystal transducers that are automatically maintained at peak operating efficiency to allow the optimum cleaning of articles which range from integrated-circuit silicone wafers and hard disk platters, to small mechanical components.

The preferred embodiment as shown in FIGS. 1 through 11 is comprised of the following major elements: a computer 12, a software program 14, a keypad/display unit 16, a front panel 18, a crystal control (CC) circuit 20, a power amplifier 22, a standing wave ratio (SWR) circuit 24, an analog-to-digital (A/D) converter 26, a power switching circuit 28, a power supply 30 and a plurality of crystal transducers 32 that supply acoustic/mechanical energy into a cleaning tank 40. The CC circuit 20 is further comprised of a digital-to-analog (D/A) converter 36 and a main oscillator 38.

The computer-controlled ultrasonic cleaning system 10 is designed to automatically perform a pre-programmed, sequential cleaning cycle which continues to run until all pre-programmed parameters are satisfied and the system is terminated. The computer 12 is operated by the software program 14 in combination with the keypad/display unit 16. The computer is preferably comprised of at least a 486DX33 motherboard having 4 megabytes of RAM, a 3.5 inch floppy disk, an 850 megabyte hard drive, a standard P.C. BIOS and MSDOS. In addition to the above requirements, the computer 12 utilizes five plug-in hardware cards and a software application to complete its programmed tasks. The plug-in cards consist of a VGA display adapter which attaches to a front panel video display, a floppy-drive/hard-disk-drive/serial I/O card, an 8 input 12 bit A/D converter board, a sixteen relay/IO card, and the specially designed crystal control (CC) circuit 20.

Figure 1:
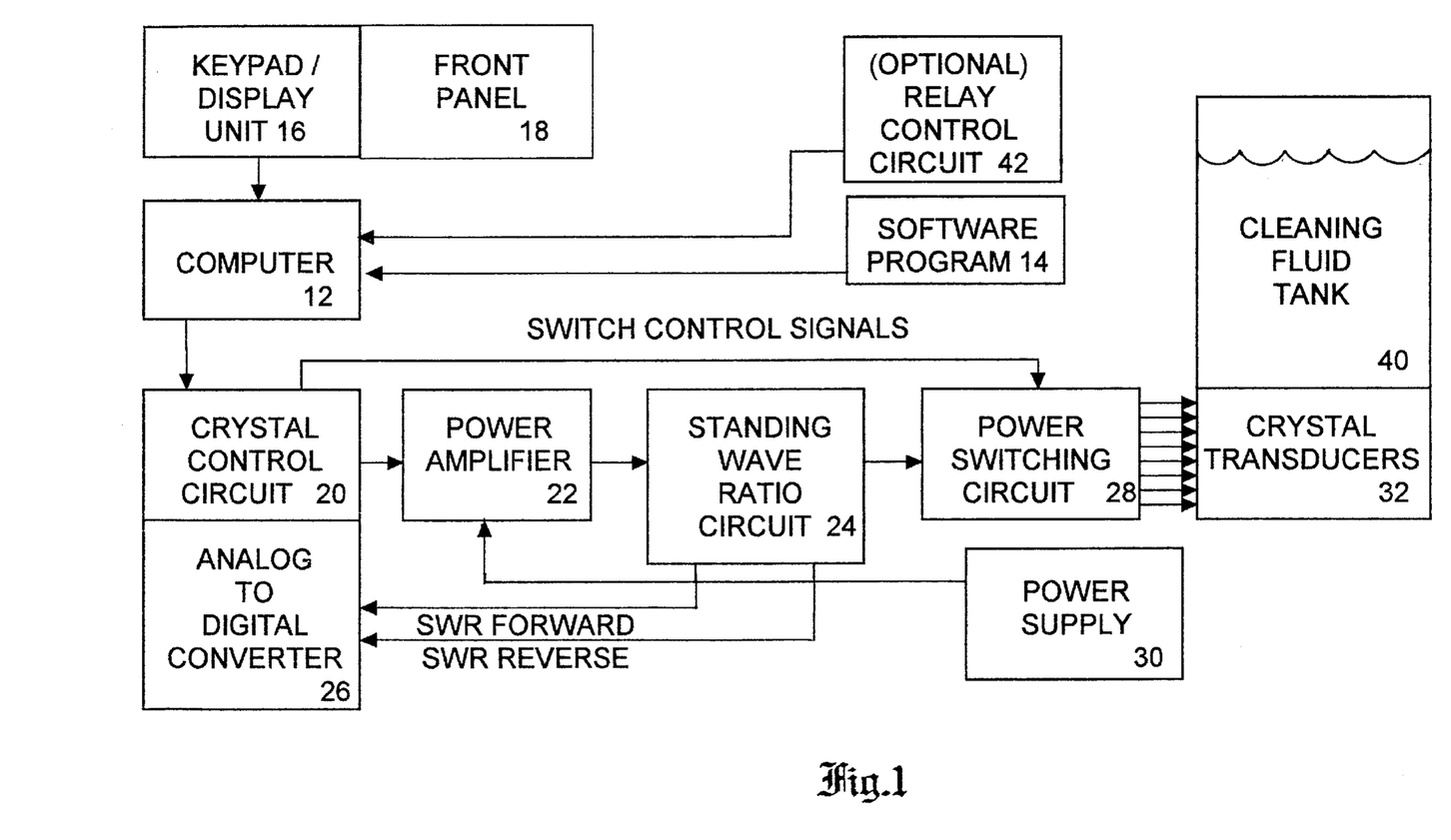
FIG. 1 is an overall block diagram of the hardware utilized by the computer-controlled ultrasonic cleaning system.
Figure 2:
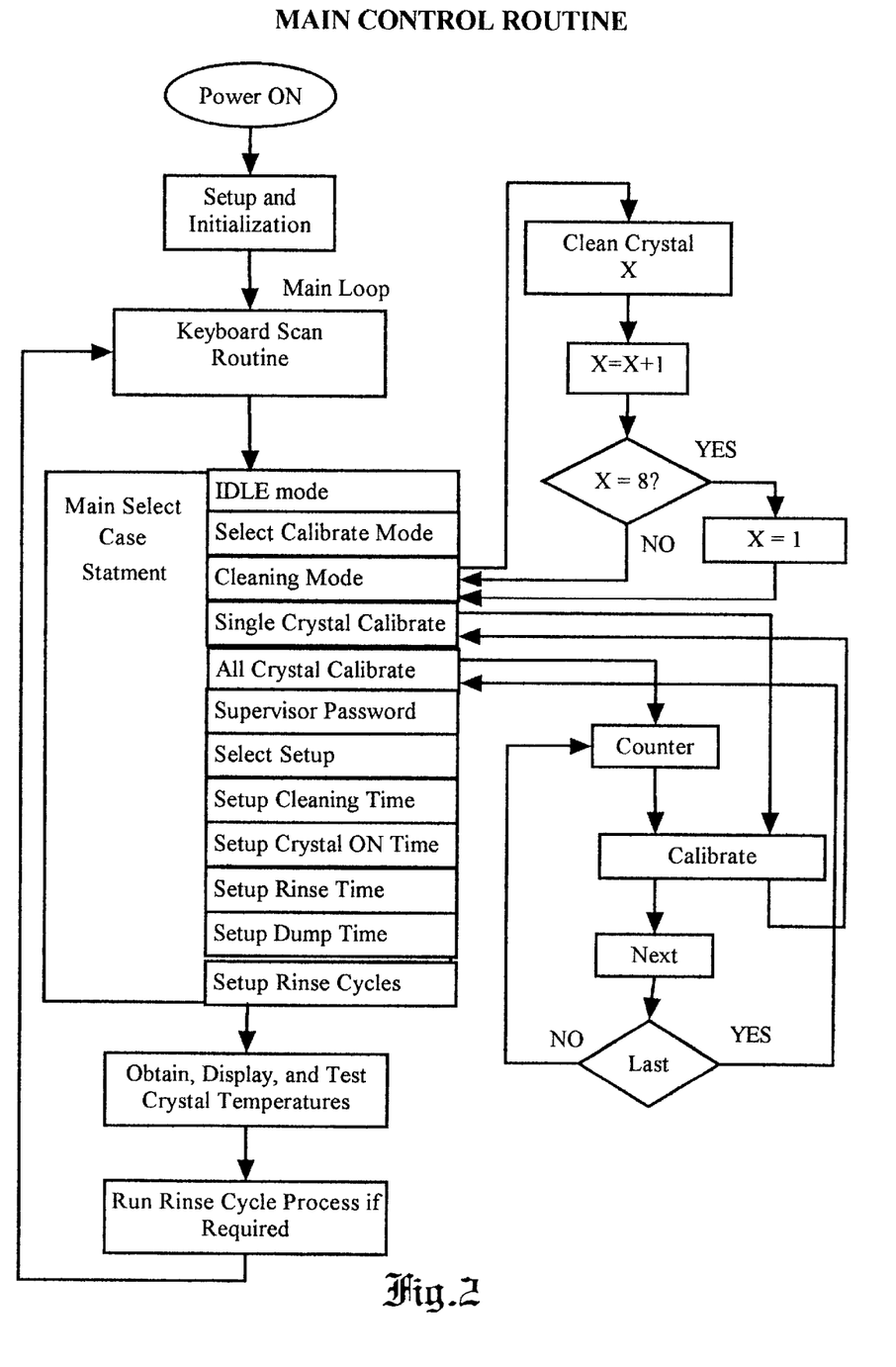
FIG. 2 is a computer software flow diagram of the system main control routine.
Figure 3A:
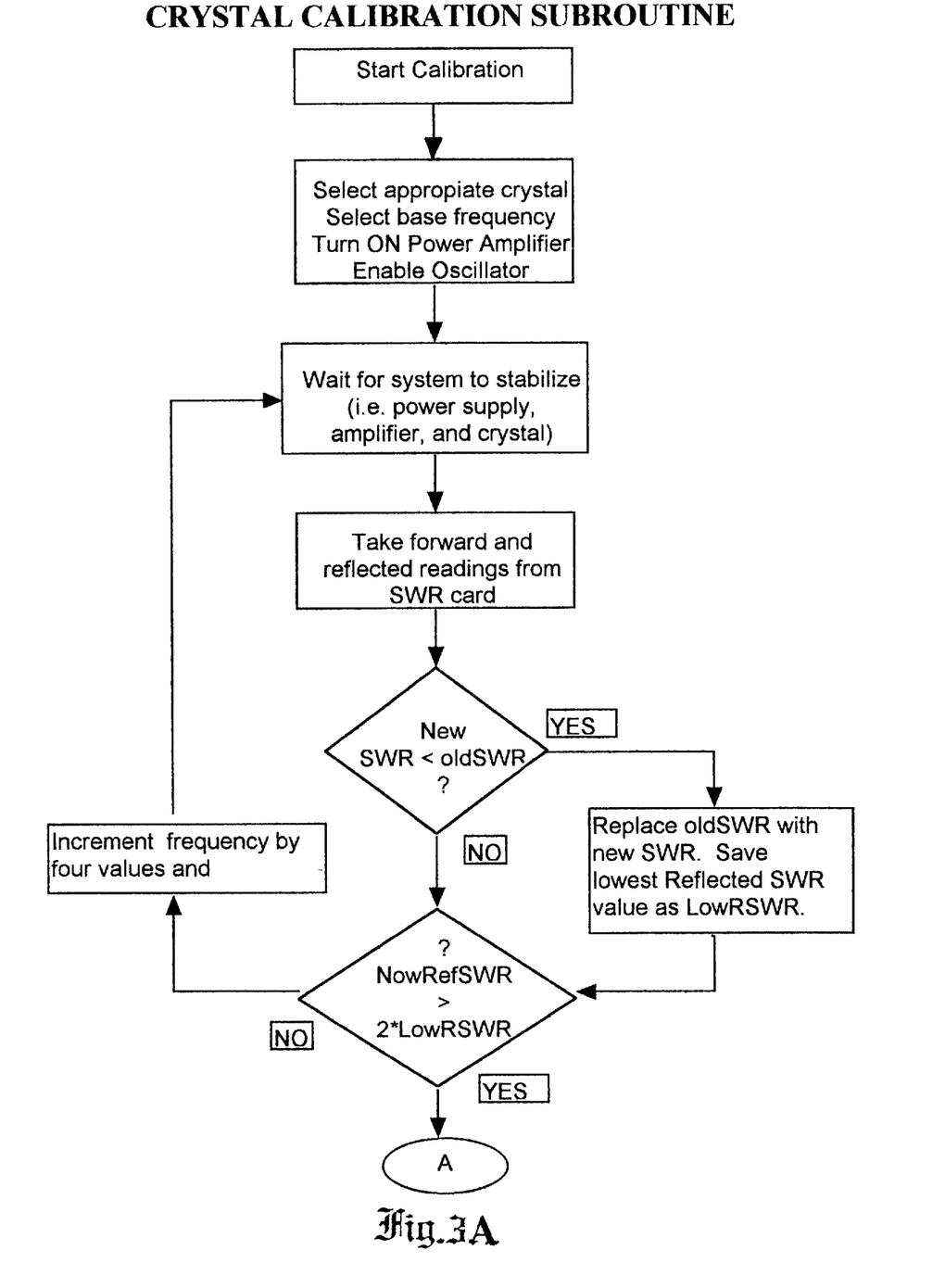
FIGS. 3A and 3B is a computer flow diagram of the system crystal calibration subroutine.
Figure 3B:
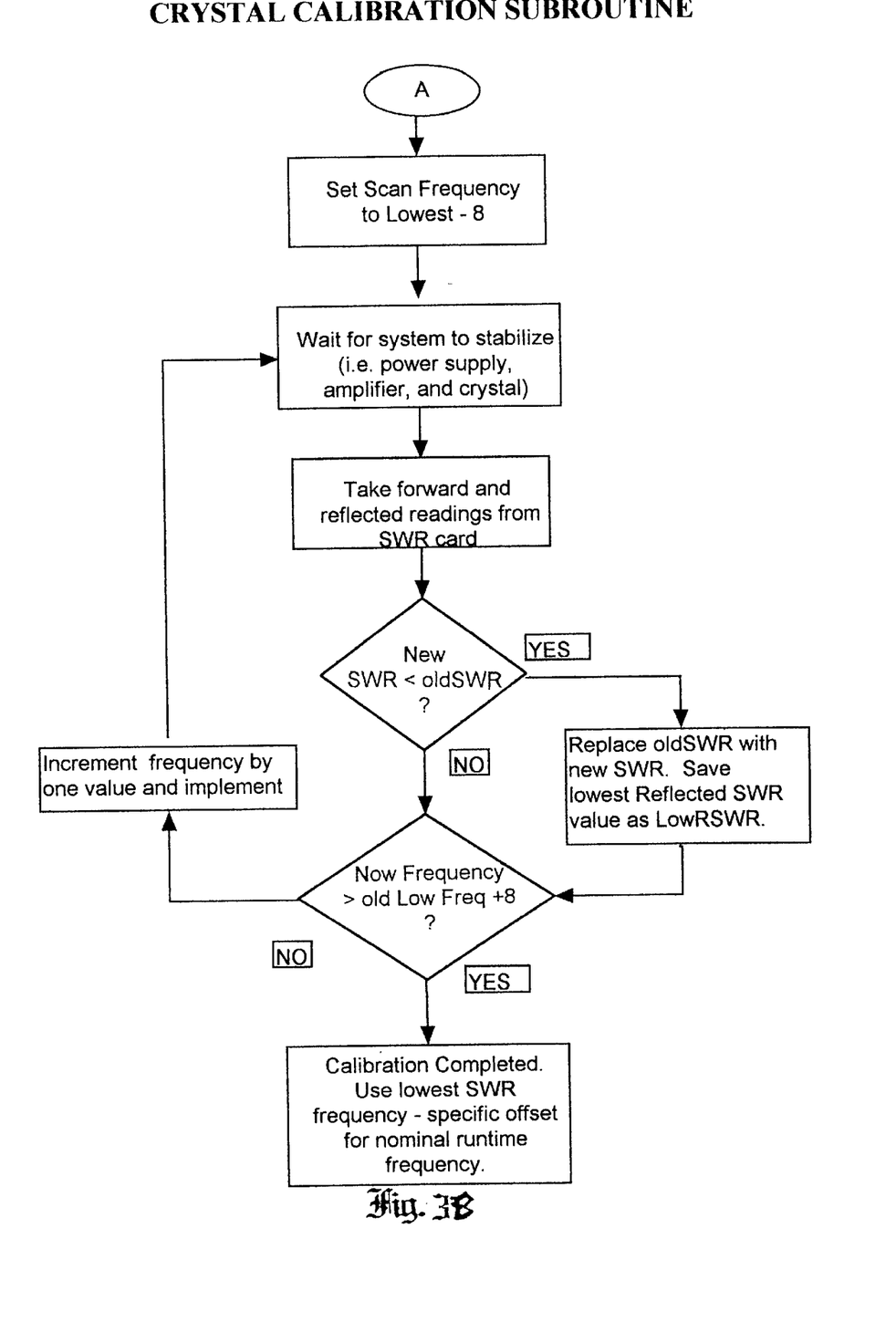
Figure 4:
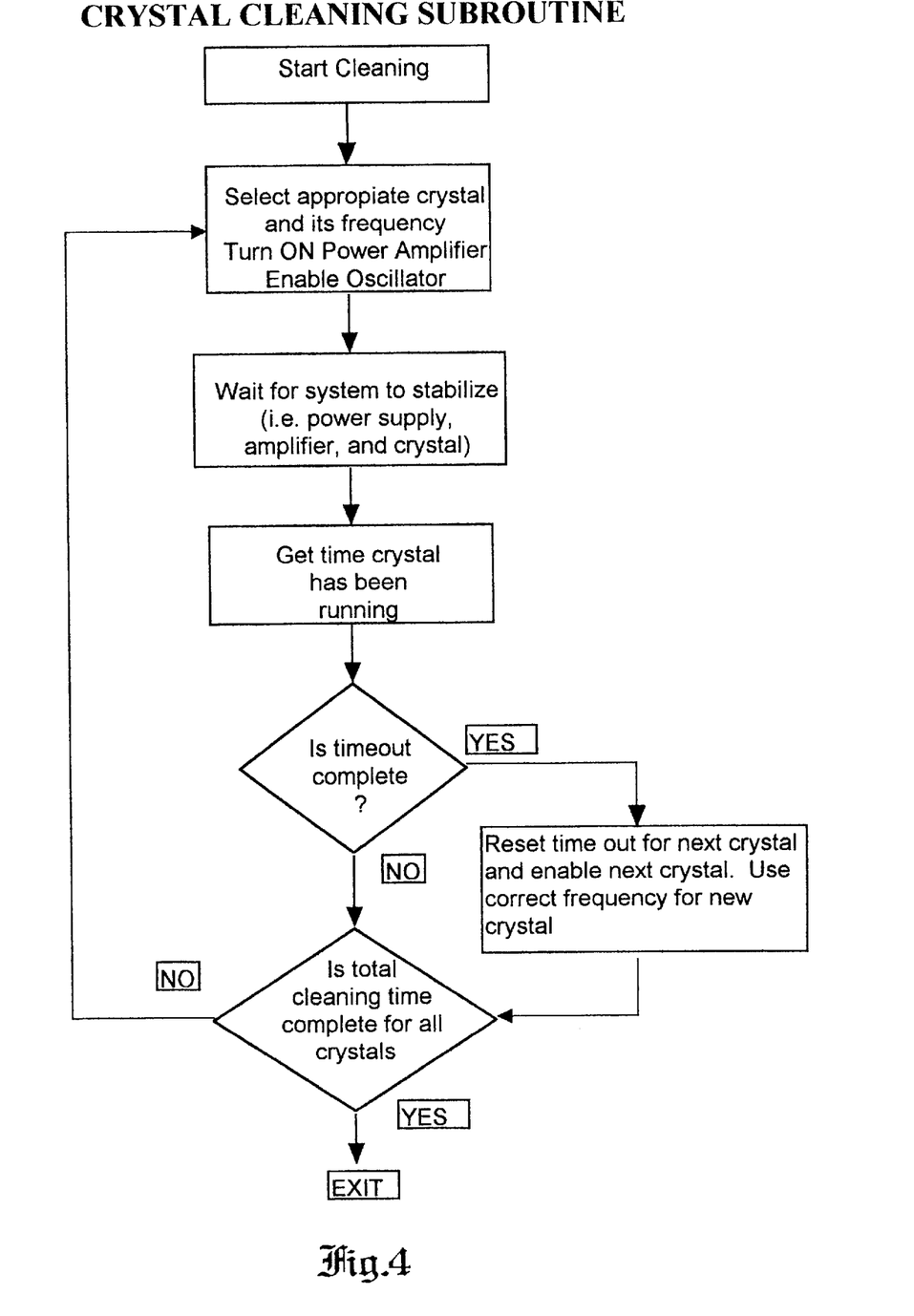
FIG. 4 is a computer flow diagram of the system crystal cleansing subroutine.

The software program 14 as shown in FIG. 1 and in the flow diagrams of FIGS. 2, 3A, 3B and 4 is divided into a main control routine as shown in FIG. 2, a crystal calibration subroutine as shown in FIGS. 3A and 3B, and a crystal cleansing subroutine as shown in FIG. 4.

The main control routine runs continuously and determines which other routines are to be run at any one time. The main control routine selects statements that are run singularly as needed and are interlocked so that only the function or subroutine which needs to be operating will operate. The stand alone subroutines at the end of the loop operate continuously in order to keep certain background operations functioning at all times, i.e., temperature and voltage measurements.

Figure 8:
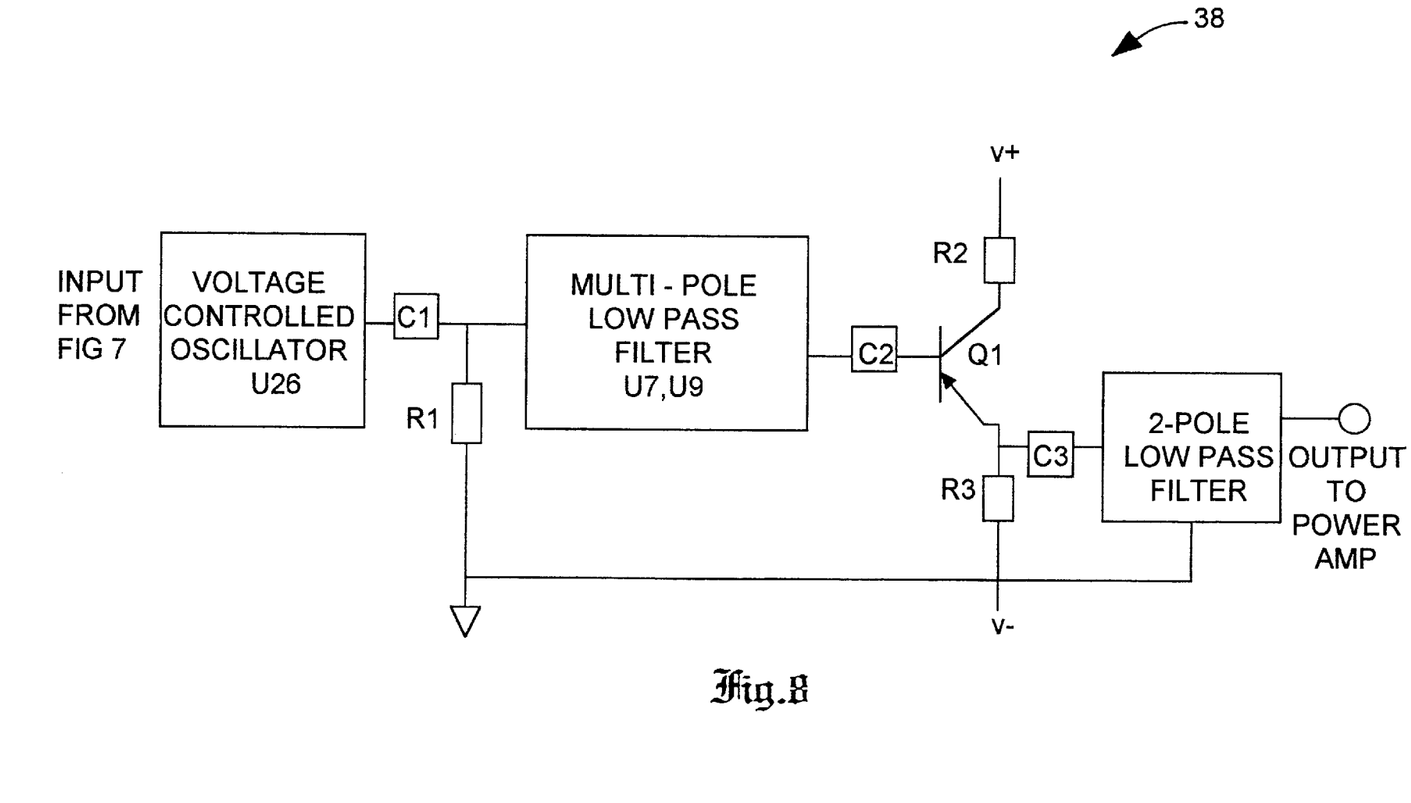
FIG. 8 is a block diagram of the main oscillator.

The software subroutine for performing the crystal calibration is shown in FIGS. 3A and 3B. The figures show both a coarse first pass scan as well as a finer second scan. These scans utilize an interactive method wherein the frequency of the scan is the output to the digital-to-analog converter 36 which converts the digital value to a real time voltage which, in turn controls the frequency of the waveform output by the voltage controlled main oscillator 38. The waveform of the main oscillator 38, as shown in FIG. 8, is increased in amplitude and passed through a low pass filter which produces a pure sinewave of the correct amplitude to drive the power amplifier 22. The SWR circuit 24 then obtains the equivalent d-c voltages representing the forward and reverse power values. These power values are induced by the interaction of the power delivered to the crystal transducer 32 and the impedance of the crystals themselves at that specific frequency, and returns them to the A/D converter 26 for measurement. This process is performed many times at incremental frequencies until a specific set of operational criteria are met. The frequency at which the criteria are met is then placed into the memory of the computer 12 and is used to drive the crystal transducers 32 during the cleaning process.

The software subroutine for cleaning the crystals is shown in FIG. 4. This process uses the frequencies of the crystal transducers 32 located during the calibration procedure. The correct frequency for the desired crystal is applied to the power amplifier 22, and on to the crystal transducers 32. The crystals are operated one at a time, as entered by the user, in sequence until the total cleaning time is satisfied, at which time the cleaning process is completed.

Figure 5:
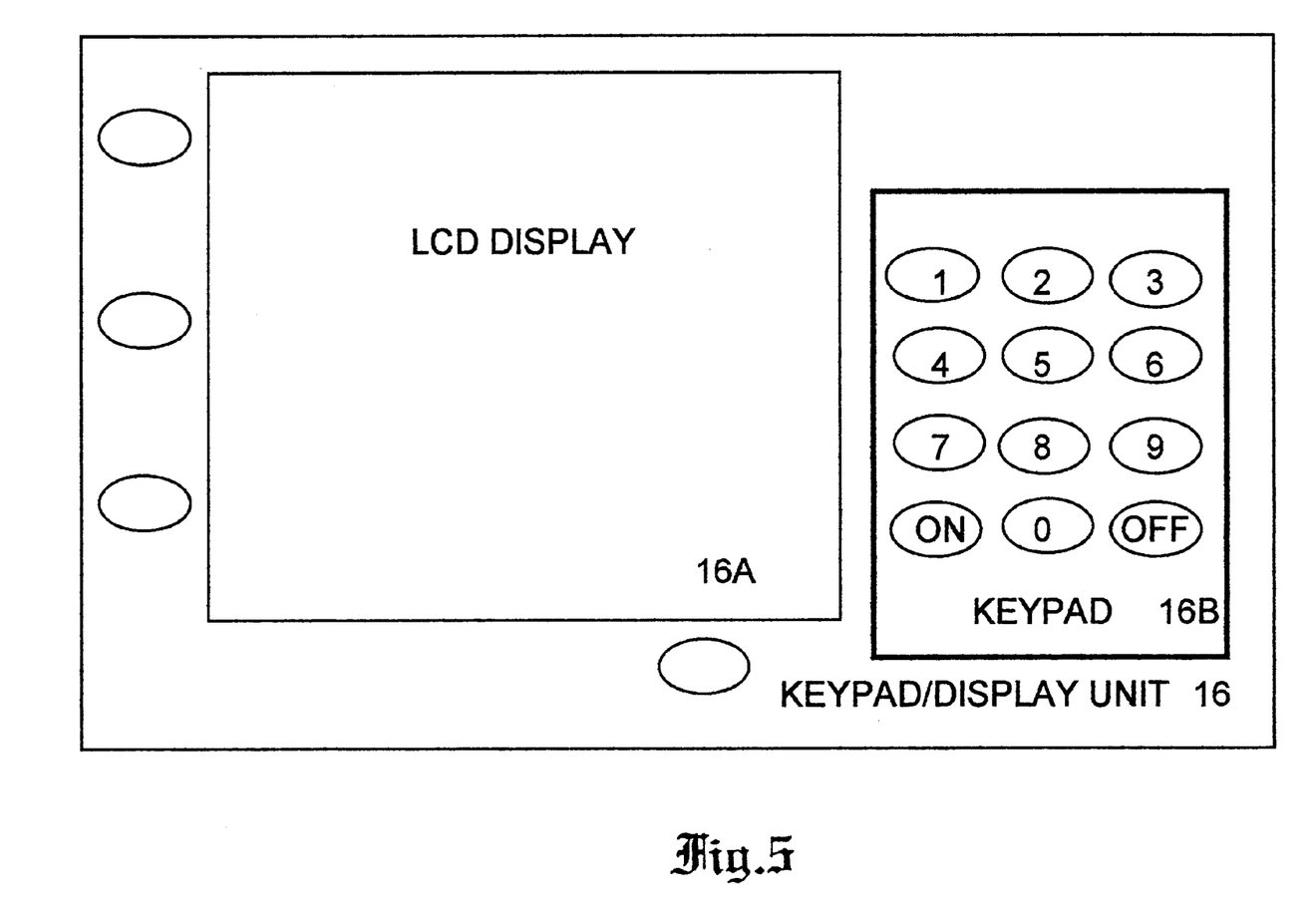
FIG. 5 is an elevational front view of a keypad/display unit which uses a black and white LCD display.
Figure 6:
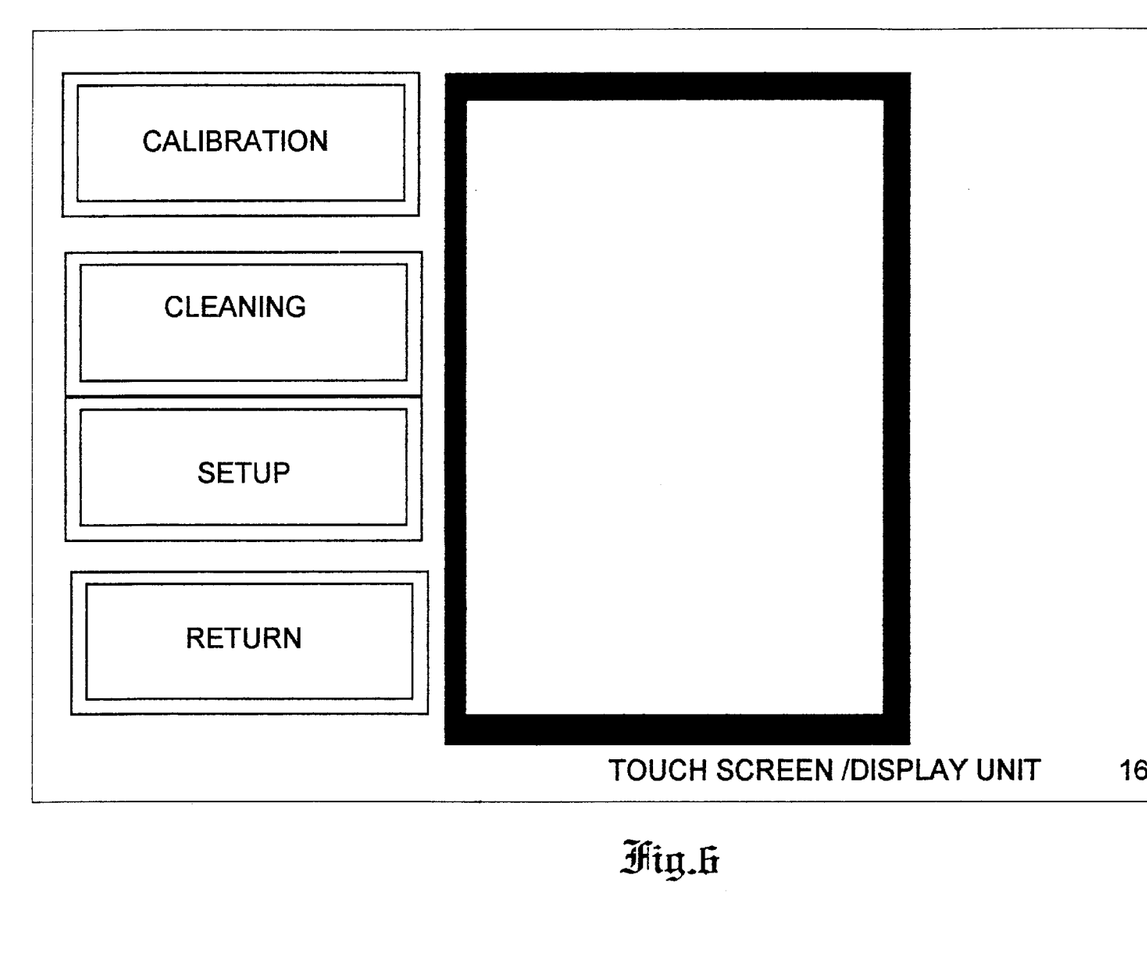
FIG. 6 is an elevational front view of a keypad/display unit that uses a touch screen that is an integral element of a color LCD display.

The keypad/display unit 16, which is an integral element of the front panel 18, may consist of two designs. The first design, as shown in FIG. 5, consists of a black and white LCD display 16A that incorporates a dedicated keypad 16B. The second design as shown in FIG. 6, consist of a color LCD display where the integral keypad is comprised of a touch screen 16C. The first design of the keypad/display unit 16 is connected to the computer 12 via a single cable that is attached to an added VGA card; the keypad 16B is attached to the crystal control circuit 20 via a cable and two small connectors through which it is scanned by the software program 14. The second design of the keypad/display unit 16 is connected to the VGA card for display control and uses a serial port on the computer to connect the touch screen 16C.

Figure 9:
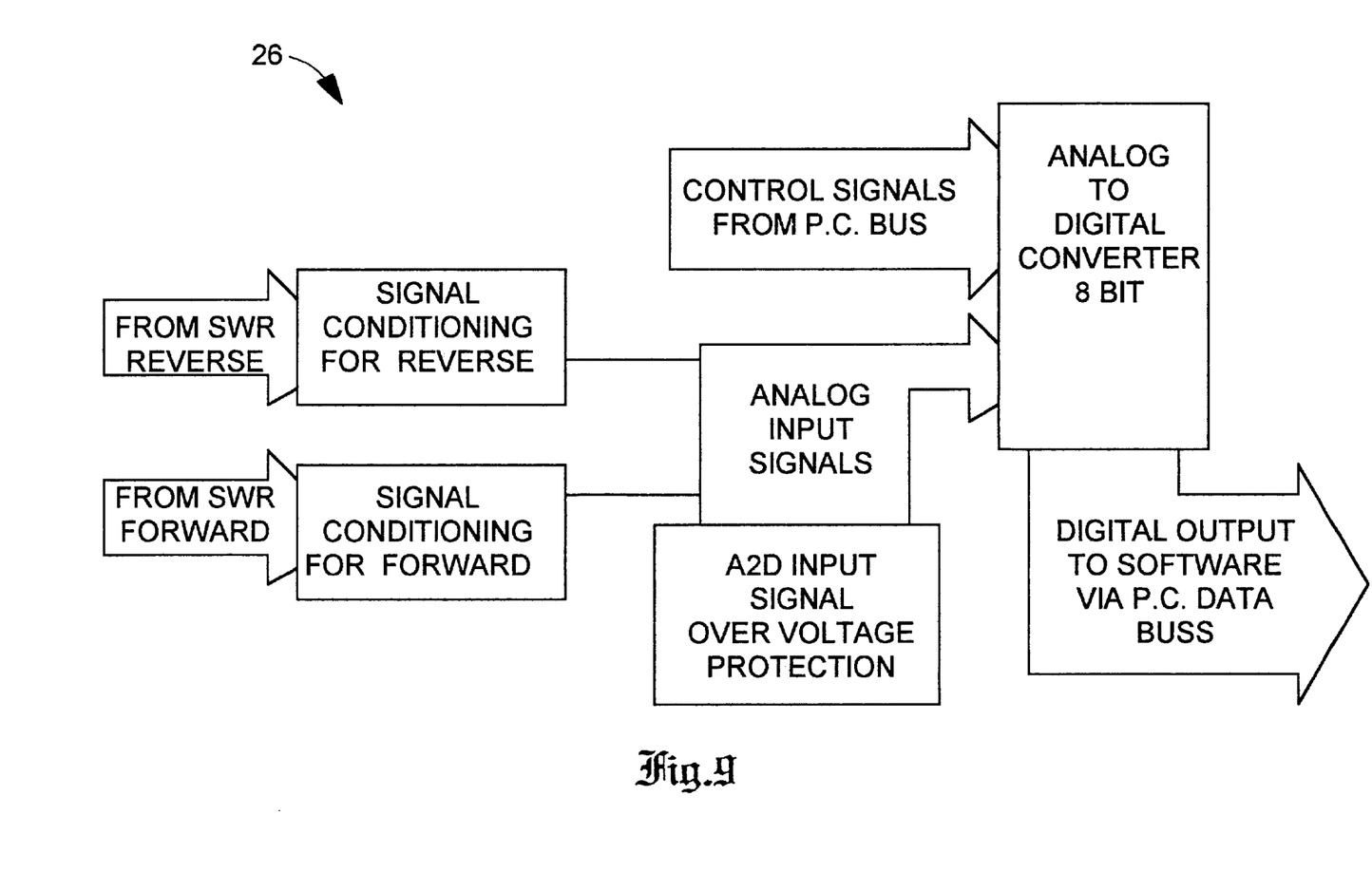
FIG. 9 is a block diagram of the analog-to-digital converter.

The first of the system's 10 hardware circuits described is the crystal control (CC) circuit 20. The CC circuit, which is shown in the overall system block diagram of FIG. 1, includes in a controlled feedback loop the digital-to-analog (D/A) converter 36 as shown in FIG. 7, the main oscillator 38 as shown in FIG. 8, and the analog-to-digital (A/D)

converter 26 as shown in FIG. 9. These circuits which operate in a feedback loop configuration with the software 14, are described in the order listed.

Figure 7:
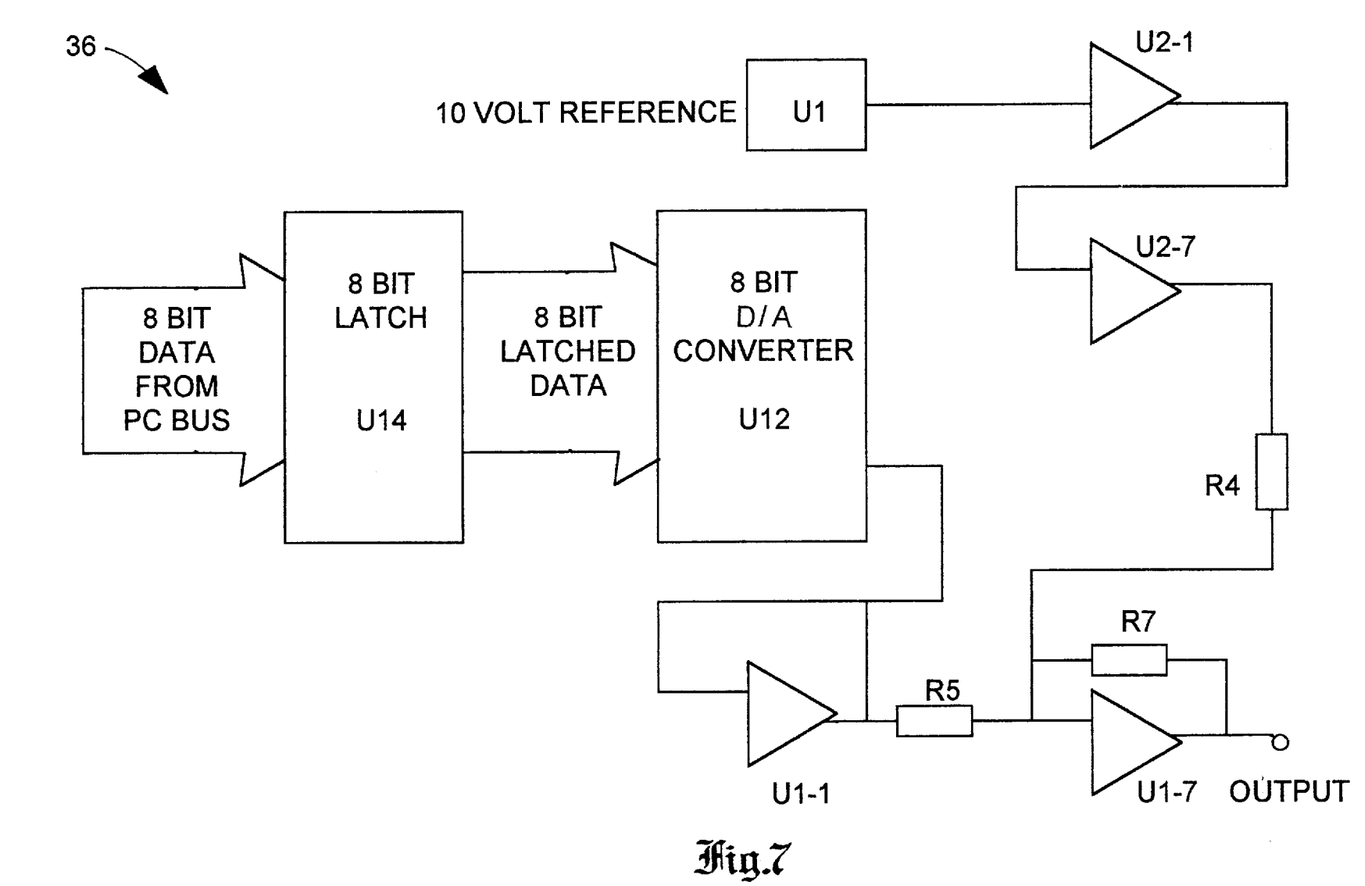
FIG. 7 is a block diagram of the digital-to-analog converter.

The software 14 produces an 8-bit digital value from the PC bus to an 8-bit latch U14 as shown in FIG. 7. From the latch U14, the 8-bit latched data is applied to an 8-bit D/A converter U12 which produces an output signal which is controlled by the software. The signal from U12 is then offset and amplified, using U2-1 and U2-7 and U1-1 and U1-7, to provide a voltage controlled oscillator U26, as shown in FIG. 8, with the precise input to enable the oscillator to produce a squarewave having a frequency which depends on the signal applied from the D/A converter U12. The squarewave is then d-c voltage offset by capacitor C1 and resistor R1, as also shown in FIG. 8, to convert the offset squarewave into a bipolar symmetrical squarewave. This waveform is then amplified and passed through a multi-pole low pass filter U7,U9 and a 2-pole low pass filter to produce a low distortion sinewave which is then applied to the power amplifier 22.

Figure 10:
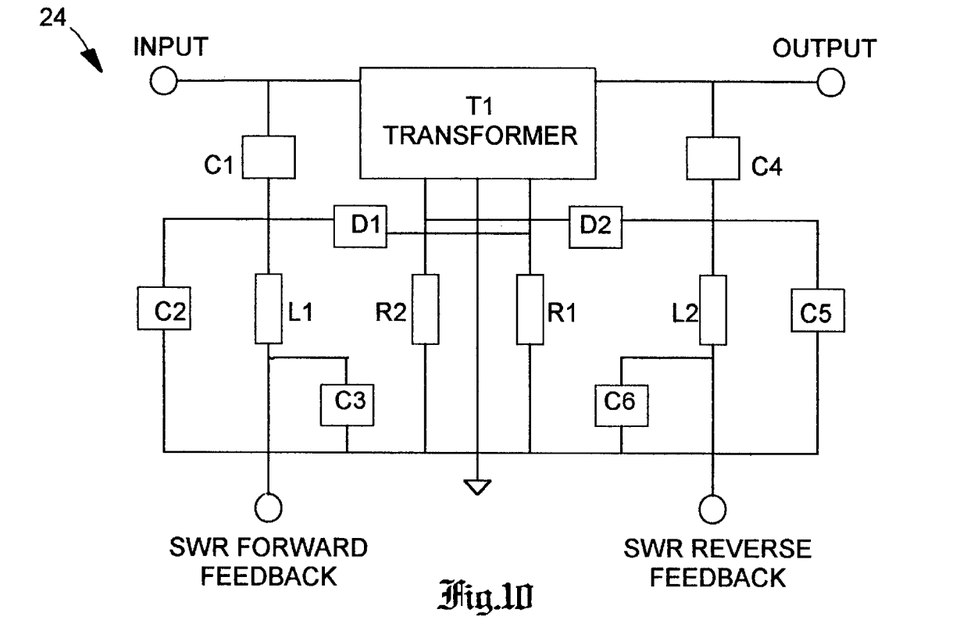
FIG. 10 is a block diagram of the SWR circuit.
Figure 11:
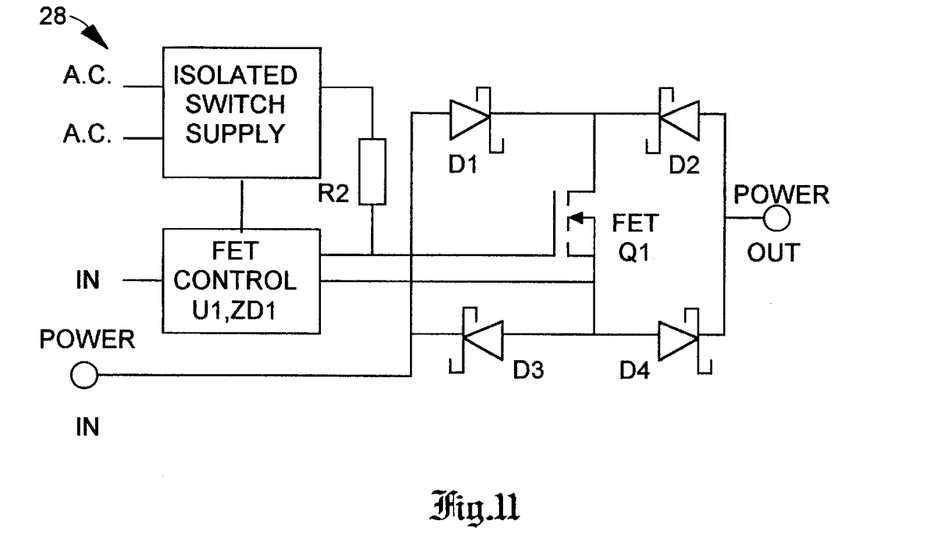
FIG. 11 is a block diagram of the power switching circuit.

From the power amplifier 22, as shown in FIG. 1, the waveform is passed, in sequence, through the SWR circuit 24, as shown in FIG. 10, the power switching circuit 28, as shown in FIG. 11, and on to the crystals transducers 32. In doing so, the waveform generates two voltage signals representative of the forward and reverse (reflected) power values. These two signals are returned to the crystal control circuit 20 via the analog-to-digital converter 26 as shown in FIGS. 1 and 10. The software 14 as shown in FIG. 1, then reads these values and uses them in the algorithms that operate the system 10.

The SWR circuit 24, as shown in FIGS. 1 and 10, is designed to receive the low distortion output signal from the power amplifier 22 as shown in FIG. 1. The circuit 24 basically consists of a conventional SWR circuit except for the following modifications: it has been re-designed for the frequency range of the main oscillator 38, it is comprised of two SWR circuits which respectively produce an SWR forward signal and a SWR reverse signal. Both the SWR forward and revese signals are routed to the CC circuit 20, via the analog-to-digital converter 26. From the CC circuit 20, the signals are read and used by the software 14 to produce appropriate control signals. The circuit 24 also produces a d-c voltage whose relative level reflects the amplitude of the SWR forward reverse signals. This is very critical in the operation of the entire feedback control loop.

The power switching circuit 28, as shown in FIGS. 1 and 11 is applied the plurality of switch control signals from the CC circuit 20 and a d-c voltage from the SWR circuit. The circuit 28 produces a plurality of control signals, as best shown in FIG. 1, and controls to which crystal transducer 32 a specific control signal is to be applied. The circuit 28 uses a medium speed, field effect transistor (FET) Q1 of high voltage and medium current characteristics as a primary switching element. Around the FET switch is a schottky fullwave bridge circuit consisting of diodes D1–D4 which can handle the 0.8 MegHz frequency range as well as the voltages and currents within the circuit while inducing minimal distortion in the power signal passing through it. The FET Q1 is controlled by a unique floating power supply, a FET control U1, ZD1 and an isolated switch supply S1 which is isolated from the rest of the electronic circuitry by more than 500 volts. The separate isolated switch supply S1 consists of an isolated winding on a main transformer, a small full wavebridge rectifier, and a filter capacitor as a floating supply for each switch. This design allows the isolated switch supply S1 and FET control U1, ZD1 to be connected in a manner that allows near total isolation from the rest of the circuitry while allowing complete ON-OFF control of the FET Q1 while remaining immune to electronic noise and other external electromagnetic interference from the external environment.

The analog-to-digital (A/D) converter 26, as shown in FIG. 1 accepts and converts the forward and reverse signals from the SWR circuit 24. These signals are used in two modes: in the first mode the signals are used to calibrate the crystals, and in the second mode for monitoring the nominal impedance match while the crystals are being cleaned. The crystals are calibrated at the beginning of each cleaning cycle for proper operation. While cleaning, the crystals are monitored for changes in characteristics due to the affects of heating, aging, and impedance changes that may occur due to a catastrophic failure i.e., a crack in the crystal. To the A/D converter 26, as shown in FIG. 9, is applied a pair of over voltage protection inputs from the power supply, one measuring the power supply's temperature and the other its output voltage. These inputs are used to monitor the power supply 30 for unacceptable changes in value. Additionally, the voltage applied to the power amplifier 22, as shown in FIG. 1, is also monitored by the A/D converter 26.

The switch control signals from the CC circuit 20, typically consist of a multiplicity of isolated digital signals. These signals are applied to the power switching circuit 28 together with the power signal from the SWR circuit as shown in FIG. 1. The power switching circuit 28 passes the power signals to only the crystal selected by the digital signals applied to the circuit 28. The CC circuit 20, as shown in FIG. 1, also produces a plurality of switch control signals which are not directly in the feedback loop. These signals are used to select which crystal transducer 32 will be applied power at any specific instant.

The plurality of crystal transducers 32, are each positioned on the lower surface of the cleaning fluid tank 40 as shown in FIG. 1. The tank is filled with a liquid which may consist of water, hydrazine, peroxide, or any one of a plethora of fluids used for cleaning. After the tank is filled, the crystal transducers 32 are activated by the control signal from the power switching circuit 28 in sequence for differing lengths of times and periods of operation. This type of operation is considered to be a cleaning cycle. When the crystal transducers 32 are energized by the control signal they produce an acoustic/mechanical energy which allows the liquid to become agitated which then cleans articles that are placed inside the cleaning tank. The cleaned articles can range from integrated circuit dies and hard disk platters to small mechanical components.

While the invention has been described in complete detail and pictorially shown in the accompanying drawings it is not to be limited to such details, since many changes and modifications may be made in the invention without departing from the spirit and scope thereof. For example, the system 10 can further include an optimal relay control circuit 42 which is used to control auxiliary functions. Hence, it is described to cover any and all modifications and forms which may come within the language and scope of the appended claims.

We claim:

1. A computer-controlled ultrasonic cleaning system comprising:

a) a computer having means for being operated and running a dedicated software program which controls a self calibration procedure and an automatic cleaning cycle, wherein said computer is operated through a keypad/display unit, b) an electronic system having means for operating in combination with said computer, and said software to produce a plurality of control signals, and c) a power supply having means for supplying the required power levels to said system, d) a cleaning tank having a lower surface to which is attached a plurality of crystal transducers, wherein said tank is filled with a liquid that is in contact with said crystal transducers to each of which is applied a control signal from said electronic system wherein said control signals are applied in a controlled sequence which cause said crystal transducers to sequentially produce ultrasonic waves of acoustic/mechanical energy which cleanse articles placed into said cleaning tank.

2. The system as specified in claim 1 wherein said electronic system comprises:

a) a crystal control (CC) circuit having means for operating in combination with said computer, and said software to produce a plurality of switch control signals and a low-level low-distortion a-c sinewave signal, b) a power amplifier to which is applied the low-level a-c signal from said CC circuit and a d-c voltage from a power supply, wherein said amplifier amplifies the low-level a-c signal to produce a low-distortion output signal, c) a standing wave ratio (SWR) circuit having means for receiving and passing the low-distortion output signal from said power amplifier and producing an SWR forward signal, an SWR reverse signal and a d-c voltage whose relative level reflects the amplitude of the SWR forward and reverse signals, d) an analog-to-digital converter that receives and converts the analog SWR forward and SWR reverse signals to produce a digital control signal that is applied to said CC circuit, and e) a power switching circuit to which is applied the plurality of switch control signals from said CC circuit and the low distortion d-c voltage passed on from said SWR circuit, wherein said power switching circuit switches the low distortion output signal to a single crystal transducer.

3. The system as specified in claim 2 wherein said computer is comprised of a personal computer.

4. The system as specified in claim 3 wherein said personal computer is comprised of at least a 486 DX33, with 4 Megabytes RAM, a 3.5 inch floppy disk, an 850 Megabyte hard drive, standard BIOS and MSDOS.

5. The system as specified in claim 2 wherein said keypad/display unit is dedicated and is an integral element of a black and white liquid crystal diode (LCD) display.

6. The system as specified in claim 2 wherein said keypad/display unit is dedicated and is comprised of a touch screen that is an integral element of a color liquid crystal diode (LCD) display.

7. The system as specified in claim 2 wherein said CC circuit operates in a controlled feedback loop that includes in the loop said analog-to-digital converter, a digital-to-analog converter and a main oscillator.

8. The system as specified in claim 2 further comprising a relay control circuit which is used to control auxiliary functions.

9. A computer-controlled ultrasonic cleaning system comprising:

a) a computer having means for allowing a system cleaning process to be automatically controlled, wherein said computer is operated by a software program in combination with a keypad/display unit, b) a crystal control (CC) circuit having means for operating in combination with said computer, said software and said keypad to produce a plurality of switch control signals and a low-level a-c signal, c) a power amplifier to which is applied the low-level a-c signal from said cc circuit and a d-c voltage from a power supply, wherein said amplifier amplifies the low-level a-c signal to produce a low-distortion output signal, d) a standing wave ratio (SWR) circuit having means for receiving and passing the low distortion output signal from said power amplifier and producing an SWR forward signal, an SWR reverse signal and a d-c voltage whose relative level reflects the amplitude of the SWR forward and reverse signals, e) an analog-to-digital converter that receives and converts the analog SWR forward and SWR reverse signals to produce a digital control signal that is interpreted and used by said software, f) a power switching circuit to which is applied the plurality of switch control signals from said CC circuit and the low distortion d-c voltage passed on from said SWR circuit, wherein said power switching circuit switches the low distortion output signal to a single crystal transducer, and g) a cleaning tank having a lower surface which is in contact with a plurality of crystal transducers, wherein said tank is filled with a liquid that is in contact with said crystal transducers to each of which is applied a control signal from said power switching circuit, wherein said control signals are applied in a controlled sequence which cause said crystal transducers to sequentially produce ultrasonic waves of acoustic/mechanical energy which cleanse articles placed into said cleaning tank.

10. The system as specified in claim 9 wherein said computer is comprised of a personal computer.

11. The system as specified in claim 10 wherein said personal computer is comprised of at least a 486 DX33 with a 4 megabyte RAM, a 3.5 inch floppy disk, an 850 megabyte hard drive, standard BIOS and an MSDOS.

12. The system as specified in claim 9 wherein said keypad/display unit is dedicated and is included as an integral element of a black and white liquid crystal diode (LCD) display or a touch screen that is an integral of a color LCD display.

13. The system as specified in claim 9 wherein said CC circuit operates in a controlled feedback loop that includes said analog-to-digital converter, a digital-to-analog converter and a main oscillator.

14. The system as specified in claim 9 wherein the digital signals produced by said A/D converter from the SWR forward signal and the SWR reverse signal are used respectively to calibrate said transducer crystals and to monitor their nominal impedance match while said transducer crystals are being cleansed.

15. The system as specified in claim 14 wherein said A/D converter monitors:

a) said power supply for unacceptable changes in power levels, b) the power supply voltage applied to said power amplifier, and c) the temperature of a heatsink located on said power amplifier, and the inside ambient temperature of the chassis of said computer.

16. The system as specified in claim 9 wherein said power amplifier is designed to amplify the low-level a-c signal from said CC circuit, which is in milliwatts, to a power output ranging from 50 to 400 watts.

17. The system as specified in claim 9 further comprising a relay control circuit which is used to control auxiliary functions.

18. The system as specified in claim 9 wherein said plurality of switch control signals are each tuned to the corresponding resonant frequency of each said crystal transducer.

19. The system as specified in claim 9 wherein said software program is comprises:
   A. a main control routine comprising the following sequential statements:
   a) power on,
   b) set and initialization,
   c) keyboard scan routine that selects the following statements:
      (1) IDLE mode
      (2) Select Calibrate Mode
      (3) Cleaning Mode
      (4) Single Crystal Calibrate
      (5) All Crystal Calibrate
      (6) Supervisor Password
      (7) Select Setup
      (8) Setup Cleaning Time
      (9) Setup Crystal ON Time
      (10) Setup Rinse Time
      (11) Setup Dump Time
      (12) Setup Rinse Cycles
   d) obtain, display, and test crystal temperature, and
   e) run rinse cycle process if required, return to keyboard scan routine,
   B. a crystal calibration subroutine comprising the following sequential statements:
   a) start calibration
   b) select appropriate crystal, select base frequency, turn On power amplifier enable oscillator,
   c) wait for system to stabilize,
   d) take forward and reflected readings from SWR card,
   e) new SWR<old SWR,
      (1) no—increment frequency by four values and return to c),
      (2) yes—replace old SWR with new SWR; save lowest reflected SWR value as low RSWR, and go to f),
   f) set scan frequency to lowest—8,
   g) wait for system to stabilize (i.e., power supply, amplifier and crystal),
   h) take forward and reflected readings from SWR card,
   i) new SWR<old SWR,
      (1) no—increment frequency by one value and implement and return to g),
      (2) yes—calibration completed,
   C. crystal cleaning subroutine,
   a) start cleaning,
   b) select appropriate crystal and its frequency, turn ON power amplifier enable oscillator,
   c) wait for system to stabilize, (i.e., power supply, amplifier and crystal),
   d) get time crystal has been running,
   e) is time out complete,
      (1) no—return to b),
      (2) yes—reset time out for next crystal and enable next crystal; use correct frequency for new crystal; is total cleaning time complete for all crystals—yes, and
   f) exit.

20. An electronics system designed to control and operate a multi-channel load, said system comprising:
   a) a computer having means for automatically controlling said system, wherein said computer is operated by a software program in combination with a keypad,
   b) an electronics assembly comprising:
      (1) a crystal control (CC) circuit having means for operating in combination with said computer, said software and said keypad to produce a plurality of switch control signals and a low-level a-c signal,
      (2) a power amplifier that is applied the low-level a-c signal from said CC circuit and a d-c voltage from a power supply, wherein said amplifier amplifies the low-level a-c signal to produce a low-distortion output signal,
      (3) a standing wave ratio (SWR) circuit having means for receiving the low distortion output signal from said power amplifier and producing a SWR forward signal, a SWR reverse signal and a d-c voltage whose relative level reflects the amplitude of the SWR forward and reverse signals,
      (4) an analog-to-digital converter that receives and converts the analog SWR forward and SWR reverse signals to produce a digital control signal that is applied to said CC circuit,
      (5) a power switching circuit that is applied the plurality of switch control signals from said CC circuit and the d-c voltage from said SWR circuit, wherein said power switching circuit produces a plurality of control signals, and
   c) means for allowing said multi-channel load to receive the plurality of control signals from said power switching circuit.

* * * * *